(12) United States Patent
Renfro et al.

(10) Patent No.: US 6,692,280 B2
(45) Date of Patent: Feb. 17, 2004

(54) SOCKET WARPAGE REDUCTION APPARATUS AND METHOD

(75) Inventors: Tim A. Renfro, Mesa, AZ (US); Brian C. Kluge, Chandler, AZ (US); Jiteender P. Manik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 09/964,619

(22) Filed: Sep. 28, 2001

(65) Prior Publication Data

US 2003/0064619 A1 Apr. 3, 2003

(51) Int. Cl.[7] .............................................. H01R 12/00
(52) U.S. Cl. ........................ 439/342; 439/70; 439/266; 439/372
(58) Field of Search ................................. 439/331, 341, 439/342, 372, 259, 261, 266, 70–73

(56) References Cited

U.S. PATENT DOCUMENTS

| | | | | |
|---|---|---|---|---|
| 4,456,318 A | * | 6/1984 | Shibata et al. ................. 439/68 |
| 5,109,980 A | * | 5/1992 | Matsuoka et al. ........... 206/724 |
| 5,364,286 A | * | 11/1994 | Matsuoka ................... 439/330 |
| 5,368,498 A | * | 11/1994 | Matsuoka et al. .......... 439/331 |
| 5,387,120 A | * | 2/1995 | Marks et al. ................ 439/331 |
| 5,482,471 A | * | 1/1996 | Mori et al. .................. 439/263 |
| 5,603,629 A | * | 2/1997 | DeFrasne et al. ........... 439/331 |
| 5,800,194 A | * | 9/1998 | Yamagishi ................... 439/266 |

* cited by examiner

Primary Examiner—Truc Nguyen
(74) Attorney, Agent, or Firm—Schwegman, Lundberg, Woessner & Kluth, P.A.

(57) ABSTRACT

Socket warpage reduction apparatus and method.

15 Claims, 7 Drawing Sheets

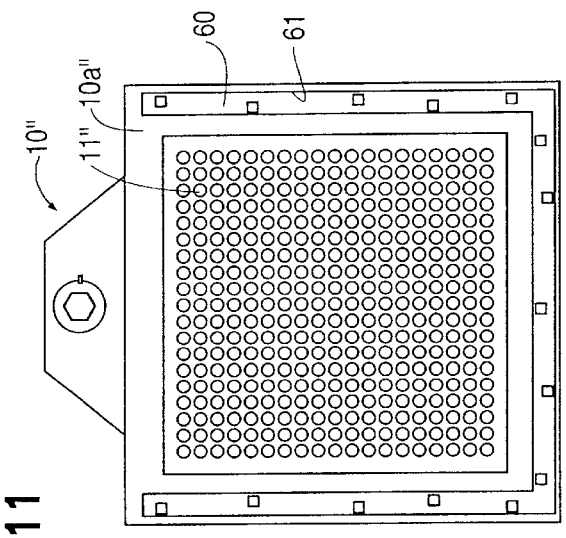
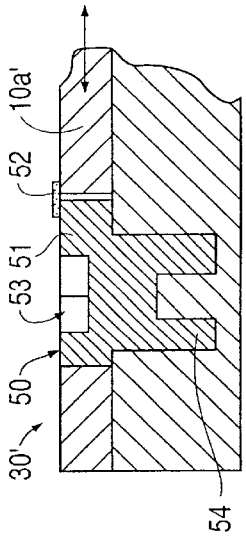
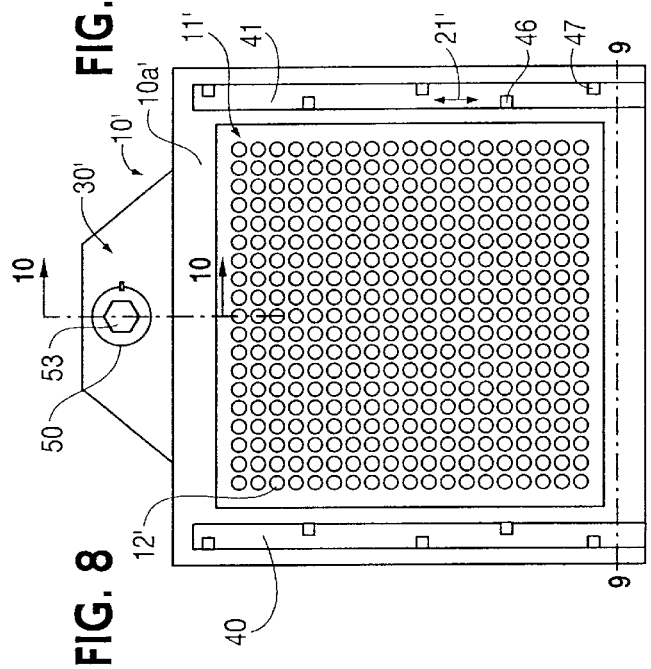
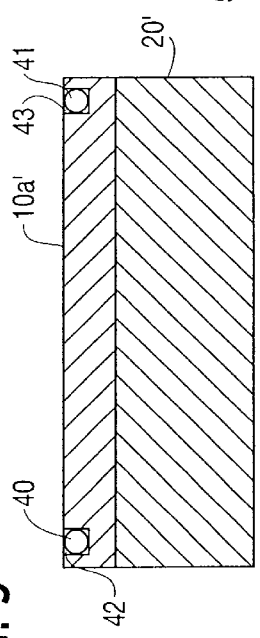

SOCKET WARPAGE REDUCTION APPARATUS AND METHOD

FIELD

The present invention is directed to socket warpage reduction. More particularly, the present invention is directed to socket warpage reduction apparatus and methods.

BACKGROUND

Electrical sockets may be used to secure electronic packages and/or integrated circuit (IC) devices, for example, onto a system board (e.g. a mother board or a printed circuit board "PCB") of an electronic system. These electrical sockets may be constructed for easy installation and replacement of electronic packages (e.g. electrical components) and/or IC devices such as complex memory chips and advanced processor chips. The electrical sockets may also be available in different sizes and configurations, including, for example, LIF sockets and ZIF sockets.

LIF sockets may be suitable for detachably securing traditional electronic packages and/or IC devices with low pin counts onto a system board of an electronic system. However, ZIF sockets are more desirable for advanced electronic packages and/or IC devices which have larger pin counts, since no or zero insertion force and removal force are required. For example, advanced processor chips with high pin counts are typically installed in a ZIF socket, which is soldered directly to a system board of an electronic system. The ZIF sockets are commonly used to secure advanced processor chips onto a PCB. This is because the advanced processor chips may be accommodated without fear of damaging the chips or the electrical pins (connections) of the processor chips which provide electrical contacts from the processor chips to the system board.

A ZIF socket may typically include a release handle/lever which, when open, permits easy installation of an electronic package and/or an IC device such as a processor chip into the socket. Subsequent closure of the handle/lever may secure the processor chip in place.

However, these commonly available LIF and ZIF sockets, used for securing an electronic package and/or an IC device onto a system board of an electronic system, contain several disadvantages, especially when electrical devices such as electronic packages or IC devices are inserted in LIF or ZIF sockets that have been secured onto a PCB of an electronic system. One disadvantage that arises is related to the process of assembling a PCB. Some socket connectors are press-fit into the PCBs or a LIF socket connector is employed. These press-fit connectors are often used on double sided reflow circuit boards, which are not processed through a wave solder machine. The presence of delicate and easily bent large pin number arrays on electrical and IC devices require the devices to sit flush and squarely on the surface of socket connectors on the PCB. It follows that any planar warpage of a socket surface mount region will not mate uniformly with the planar electronic devices, and such significantly increases the probability that the pin array may not align perfectly with a pin aperture array in the surface mount region of the socket. This results in a less than perfect interconnection of the pins with the socket connector.

Socket connectors that have experienced a variety of environmental conditions such as reflow and annealing may become twisted or turned, that is warped out of shape, which exacerbates pin insertion concerns. Accordingly, there is a need to provide an apparatus and method to ensure that electrical sockets have a flat surface mount region and, where warpage has arisen, there is a need to provide both an apparatus and method to flatten the surface mount region of the socket.

The problem of socket warpage is particularly vexing in ZIF sockets of the type that include a lever or a cam to secure an electrical device to the socket, especially where the surface mount region is present on a movable portion of a socket housing.

Warpage in ZIF sockets has been identified as a concern where socket designers have sought to ensure a flat surface mount region by the inclusion of thin (e.g., sheet metal) reinforcing frames which are co-extensive with the perimeter of a top plate of the socket. The use of thin reinforcing frames requires that the top plate to be reinforced is flat when the reinforcing frames are fitted to the edges i.e., perimeter of the top plate. This less advantageous approach at best, has limited rigidity characteristics owing to the thin (sheet metal) frames, and thus does not provide for any structure to flatten a surface mount region in the event that warpage of a surface mount region arises during molding, reflow or annealing processes routinely experienced in socket manufacture and installation on a PCB.

Heretofore socket warpage has also been addressed by modifying mold flow, mold compound or redesigning the socket so that warpage is reduced. As a socket gets larger in size, this becomes harder to accomplish.

BRIEF DESCRIPTION OF THE DRAWINGS

The foregoing and a better understanding of the present invention will become apparent from the following detailed description of example embodiments and the claims, when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIG. 8 is a top view of an example advanced cam actuated ZIF socket embodiment of the invention;

FIG. 9 is a cross-section taken along line 9—9 in FIG. 8;

FIG. 10 is a cross-section taken along line 10—10 in FIG. 8;

FIG. 11 is a top view of another example advanced cam actuated ZIF socket;

DETAILED DESCRIPTION

Figure 1:
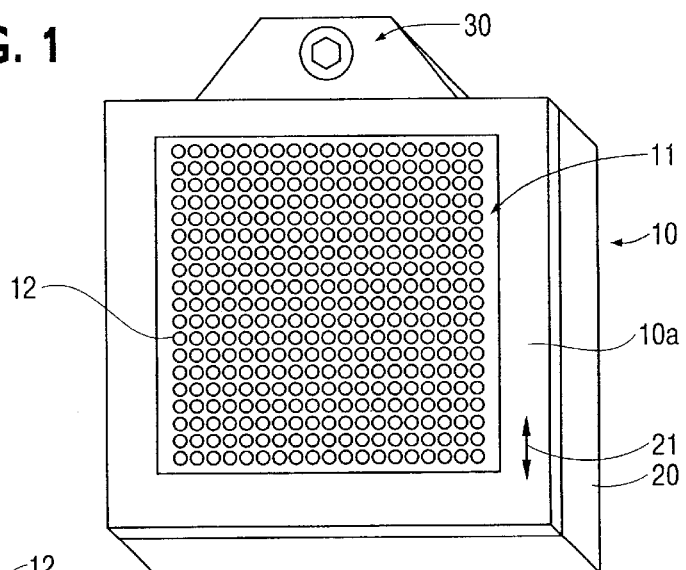
FIG. 1 is a perspective view of a background cam activated ZIF socket that is useful in gaining a more thorough understanding/appreciation of the present invention.

Before beginning a detailed description of the subject invention, mention of the following is in order. When appropriate, like reference numerals and characters may be used to designate identical, corresponding or similar components in differing figure drawings. It is important to note that the present invention is not limited to the examples and the example embodiment shown and described. In this regard, descriptive terms such as LIF socket and ZIF socket are intended to suggest types of sockets wherein the present invention finds utility. Accordingly, the term socket is intended to describe a device designed to provide electrical connections and mechanical support for an electronic or electrical component requiring convenient replacement. It is to be further understood that the present invention is applicable for use with all types of sockets, and all electronic packages and IC devices, including new processor chips which may become available as computer technology develops in the future. Further, the present invention is not limited to use in computer systems, but is suitable for applications in many industries and/or environments such as automotive, telecommunications, etc. However, for the sake of simplicity, discussions will concentrate mainly on exemplary use of a ZIF socket for use on a system board of an electronic system, although the scope of the present invention is not limited thereto.

Attention is now directed to the drawings and particularly to FIG. 1, where there is shown a less advantageous ZIF socket 10 of a cam actuated type which is used to secure an electronic device or electronic package such as a processor chip onto a system board of an electronic system. As shown in FIG. 1, the ZIF socket 10 may include socket housings comprised of a top plate (cover) 10a, a base, 20, and a cam mechanism 30 (e.g., actuated through use of a hexagonal key (e.g., Allen wrench)). The top plate 10a and the base 20 may be made from dielectric materials such as plastics, ceramics and other insulators, and can be varied in sizes, shapes and openings to secure different types of electronic packages or IC devices onto a system board of an electronic system as desired. The top plate 10a may be slidably mounted on the base 20, as indicated by double headed arrow 21. The plate 20 may be movable over a top surface of the base 20 between an open position and a closed position in response to movement of the cam mechanism 30. The cam mechanism 30 of the type illustrated will be explained ahead in full detail in conjunction with the description of FIGS. 7 to 9. The top plate 10a of an example ZIF socket 10 may contain a plurality of pin-insertion apertures 12 for accepting electrical pins from an electronic package or electrical device, not shown in this figure, but shown and described in detail in other examples hereinafter. The apertures 12 are shown deposed in a surface mount region 11.

The ZIF socket 10 is a typical socket that experiences warpage of the nature previously described and which the present invention addresses, all in a manner to be explained more fully hereinafter.

Figure 2:
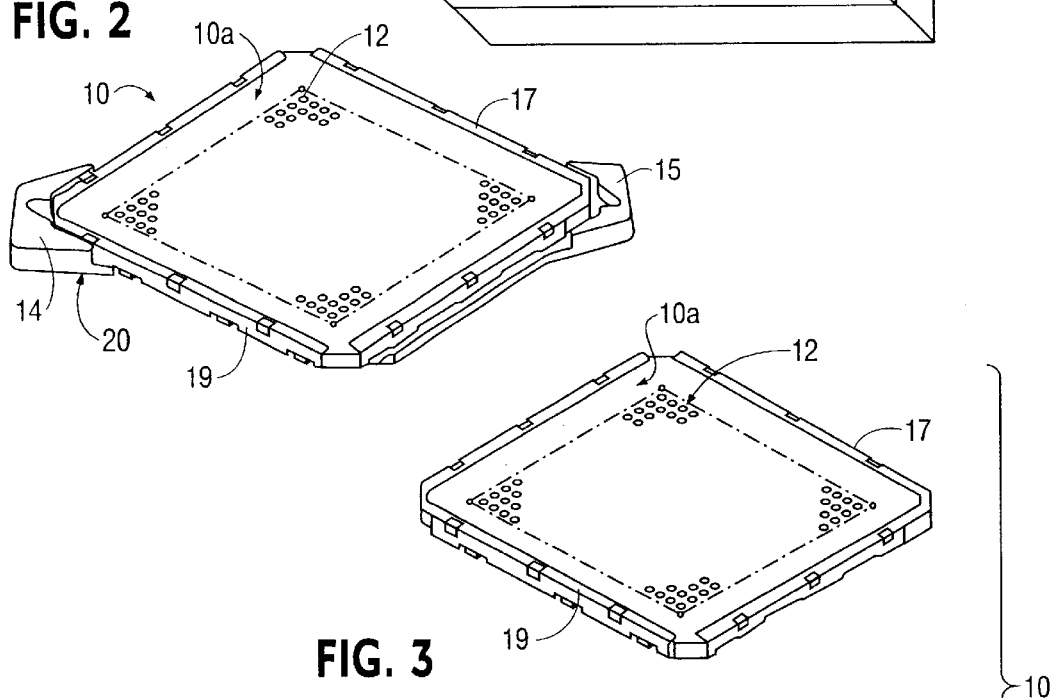
FIG. 2 is a perspective view of another background ZIF socket that is useful in gaining a more thorough understanding of the present invention.
Figure 3:
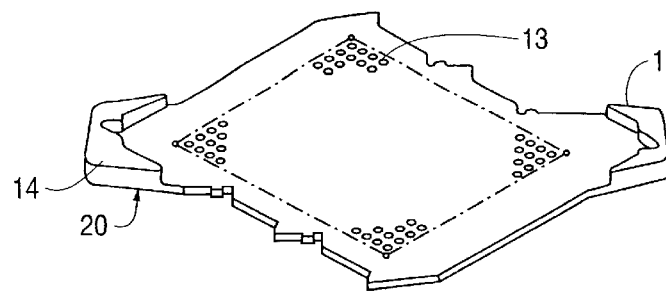
FIG. 3 is an exploded view of the socket of FIG. 2.

Attention is now directed to the perspective view of FIG. 2 and FIG. 3, in which there is depicted a ZIF socket 10 which includes a base 20, a top plate or cover 10a movably supported on the base 20 and adapted to retain an external electronic device, such as a processor (not shown). The base 20, best seen in FIG. 3, defines a plurality of receptacles 13 for receiving and retaining contact pins (not shown) therein. The top plate 10a defines a plurality of pin insertion apertures 12 corresponding to the receptacles 13 for receiving pins of the external device whereby the pins extend through the apertures 12 and are partially received in the receptacles 13. Activation means (not shown), such as a caming mechanism or screwdriver, may be incorporated in or used with the cam mechanism 30 for moving the top plate/cover 10a with respect to the base 20 in a diagonal direction along a line between the two ears 14, 15 of the base 20 thereby engaging the pins of the external device that extend through the apertures 12 of the top plate 10a and into the receptacles 13 of the base 20. The cover or top plate 10a is made of insulative material, such as plastic, and includes thin (sheet metal) reinforcing frames 17, 19, which are shown co-extensive with the perimeter of the top plate 10a. The frames 17, 19 are intended to protect the top plate 10a from an actuation force, but also to a limited extent, to enhance the rigidity thereof and suppress warpage during manufacture and operation. The reason that the thin frames 17, 19 only provided limited rigidity and warpage protection was because the IC device may have had a smaller pin array with fewer pins (than present day devices), and the LIF/ZIF sockets may have had thicker bodies (i.e., space/thickness/weight were low concerns), such that rigidity/warpage were not high concerns.

Figure 4:
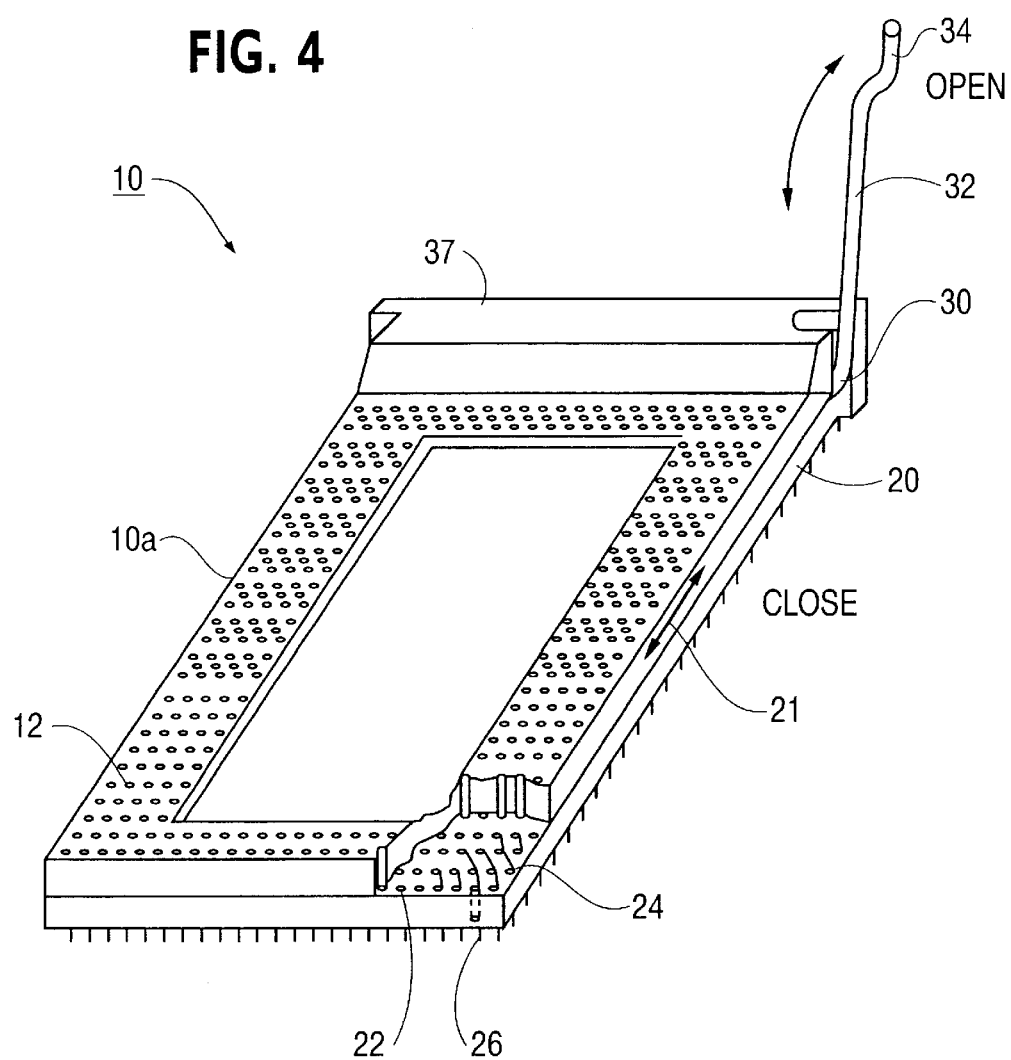
FIG. 4 is a perspective view of yet another background example of a ZIF socket useful in gaining a more thorough understanding/appreciation of the present invention.

Attention now is directed to FIGS. 4, 5, 6 and 7 where specifically FIG. 4 illustrates another less advantageous ZIF socket 10 used to secure an electronic package onto an electronic system board. The ZIF socket 10 may include a top plate (cover) 10a, a base 20, and a cam mechanism 30. The top plate 10a may be slidably mounted on the base 20 as is indicated by double-headed arrow 21. The top plate 10a may be movable over a top surface of the base 20 between an open position and a closed position in response to movement induced by the cam mechanism 30.

The top plate 10a may contain a plurality of pin insertion apertures 12 for accepting electrical pins from an electronic package such as an open die processor chip. The base 20 may contain a corresponding plurality of openings (receptacles) 22, housing spring elements 24, each of which has a tail portion 26. The tail portions 26 may protrude through a plurality of corresponding openings formed in the system board (not shown) and may be soldered, for example, to the system board circuitry of an electronic system. When the top plate 10a is in an open position, that is, when the top plate 10a moves in a first direction toward an open position, the electrical pins (e.g. connections) of an electronic package such as a processor chip may be freely inserted through the apertures 12 in the top plate 10a and into their respective openings (receptacles) 22 in the base 20 and the spring elements 24. When the top plate 10a is in a closed position, that is, when the top plate moves in a second, opposite direction toward a closed position, the electrical pins of an electronic package may be engaged physically (e.g. pinched or welded) and electrically engage the respective spring elements 24 of the base 20. Conversely, when the top plate 10a moves again back toward an open position, the pins of an electronic package may be physically disengaged from the respective spring elements 24 of the base 20 for ease of removal of the electronic package from the ZIF socket 10.

The cam mechanism 30 provides a means for sliding the top plate 10a over the base 20 between the open and closed positions. The cam mechanism may be mounted in a tunnel shaped space between the top plate 10a and the base 20, and may be located inside a raised portion 37 of the top plate 10a. The cam mechanism 30 may include a lever 32, which is transversely connected to rotate a cam element to cause the top plate 10a to translate relative to the base 20. The lever 32 may contain an end portion 34, which is bent at an angle of approximately 15°–45° from the axis of the lever 32. The bent end 34 of the lever may allow for the lever 32 to be easily grasped for rotation in the horizontal direction to translate the top plate 10a over the base 20 between open and closed positions.

Figure 5:
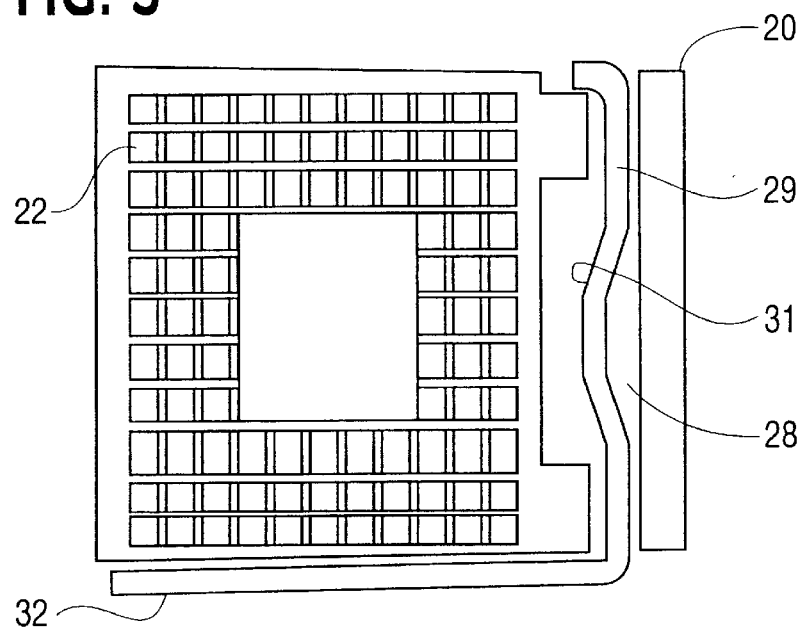
FIG. 5 illustrates a first portion of the example ZIF socket of FIG. 4 with a lever rotated to a closed position.

Refer now to FIG. 5, which depicts the base 20 disassembled from the top plate 10a of the ZIF socket 10. In this illustration a channel 28 has a generally T-shaped configuration that accommodates a camshaft 29. The camshaft 29 is shown as a rod having a circular cross-section with a jog 31 that functions as a cam lobe that provides an eccentric portion that can deliver an inward thrust for purposes of translating the top plate 10a over the base 20, when lever 32 of the cam mechanism 30 is rotated in a predetermined direction (e.g. horizontal direction). Alongside the channel 28 the base 20 includes an array of pin receiving receptacles/openings 22 adapted to accommodate springs not shown and/or the electrical pins from an electronic package such as a processor chip.

Figure 6:
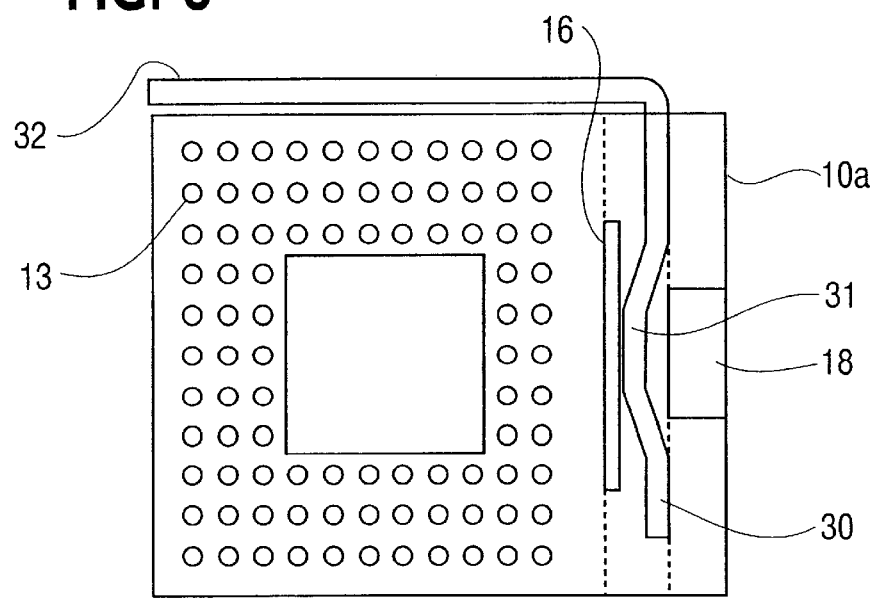
FIG. 6 illustrates a corresponding mating portion of the ZIF socket of FIG. 4 with a lever shown rotated in a closed position.

In FIG. 6 there is illustrated an underside view of the top plate 10a as it would be seen when the top plate 10a is disassembled from the base 20. Note here that the jog/cam lobe 31 is positioned adjacent to a retaining post 16, 18 which thereby allows the transmission of a caming force to the retaining posts 16, 18 so as to generate a force necessary to translate the top plate 10a over the base 20, when the lever 32 of the cam mechanism 30 is rotated in the predetermined direction between open and closed positions.

Figure 7:
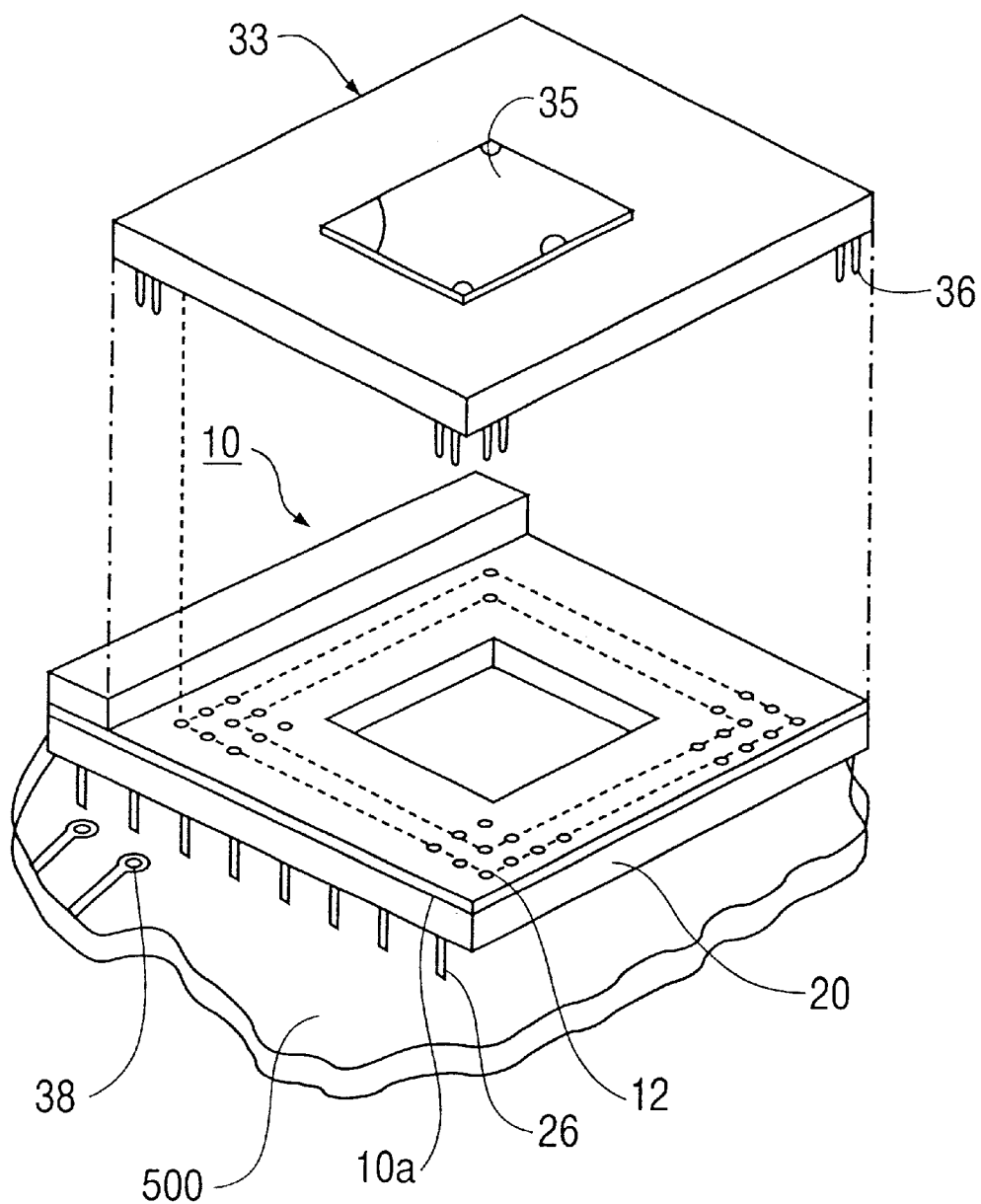
FIG. 7 is a perspective view of a background example of a ZIF socket and an electronic package.

FIG. 7 illustrates an example of a ZIF socket used for securing an electronic package 33 onto a system board 500 of an electronic system. Such a system board 500 may be a commonly used board, known as a printed circuit board (PCB) or a mother board which may contain a plurality of through-holes 38 for solder mounting the ZIF socket for easy installation and replacement of electronic packages and/or IC devices from the system board 500. The ZIF socket may include a top plate 10a, a base 20 and a cam mechanism 30 assembled and ready for supporting the electronic package 33. Here the electronic package 33 is shown having an open die processor chip 35 disposed thereon. Optionally, position pins 36 of the electronic package 33 and corresponding pin insertion apertures 12 of the ZIF socket 10 may be utilized to retain the electronic package 33 relative to the ZIF socket 10.

FIG. 8 and FIG. 9, when studied in conjunction with the description that follows, will make apparent that FIG. 9 is a top view of an example advanced ZIF socket 10' that includes a socket housing comprised of a top plate (cover) 10a' and a base 20'. The top plate 10a' is movable in the direction indicated by the double-headed arrow 21'. The top plate 10a' further includes a surface mount region 11' for an electrical or electronic device not shown. Within the surface mount region 11' of the top plate 10a' there is provided an array of pin insertion apertures, such as the referenced aperture 12'.

In the manufacture and use of sockets or socket connectors, as they are sometimes called, the sockets experience planar warpage that involves the twisting or turning out of shape of the socket, which results in the socket's surface mount region no longer remaining flat as is necessary for the mounting thereon of large pin array electrical or electronic devices.

The problem of warpage reduction in sockets is addressed in the practice of the invention in the example of the advanced ZIF socket of FIG. 8. In the practice of the present invention the sockets can be made flatter when independent (rigid) bars or rods 40, 41 are inserted into grooves 42, 43 (see FIG. 9) after the molding of the socket. (Hereinafter, within the description and claims, the term "bars" may be used generically to represent all viable types of rigid/warpage-reducing members, e.g., rods, boards, tubes, etc.) The insertion of the bars 40, 41 into the grooves 42, 43 flattens the surface mount region 11' which guarantees the socket will meet flatness requirements, which will improve yields, simplify contact insertion and ease of actuation by reducing warpage-induced friction that would arise between a warped top plate 10a' and a top surface of the base 20'. The grooves 42, 43 may be of a U-shaped cross-section and the bars 40, 41 may be rod shaped. Clips 46, 47 may also be employed for clipping and retaining the bars into the grooves.

It is important to appreciate that the warpage bars 40, 41 may be inserted into the top plate 10a' contiguous to the surface mount region 11' before or after any reflow processes, depending on needed assembly flow. Alternative to insertion, the warpage bars may have the top plate 10A' injection-molded around such bars. Should the ZIF socket 10 experience an annealing process, the process may benefit from the bars 40, 41 being inserted or included before reflow, whereas warpage correction effects may be more beneficial after reflow.

The simple action of securing a socket to a printed circuit board (PCB) by means of solder balls (e.g., a scoket having a ball grid array (BGA) thereon), which are eutectic in nature, inherently involves a reflow of the solder, that is the melting and resolidification of solder to form an electrical connection between the socket and PCB. It is not uncommon to discover after the reflow process that the socket has become warped and the surface mount region is no longer flat. Accordingly, an increase in warpage usually occurs during reflow. It follows therefore that the insertion of the rigid bars will be most advantageous. Sockets that have experienced reflow often benefit from an annealing process that relieves internal stress in the socket material.

By way of review it should be apparent that the highly advanced example of the socket depicted in FIG. 8 and FIG. 9 is comprised of socket housing top plate 10a' having a surface mount region 11' for an electrical device and at least one rigid bar, such as bars 40, 41, secured in grooves 42, 43 and contiguous to the surface mount region 11', to thereby ensure the surface mount region 11' is flat and remains flattened in varying ambient conditions.

Attention is now directed to FIG. 8 and FIG. 10, which, when studied in conjunction with the description that follows, will explain the nature of the cam mechanism 30'. In this example of the present invention the cam mechanism 30' is not structurally significant to the warpage reduction function of the warpage bars 40, 41. However, the movement of the top plate 10a' will now be explained in order to facilitate a better comprehension of a ZIF socket environment in which the present example of the invention finds utility.

FIG. 10 illustrates a cross-section taken along line 10—10 in FIG. 8 and reveals a cam 50 that includes a cam lobe 51 that engages the top plate 10a'. The cam 50 further includes a cam stop 52 to make sure the cam 50 does not over rotate. The cam is provided with an opening 53 into which a tool (not shown) may be inserted to rotate the cam mechanism 30'. A base cam post 54 is provided on which the cam 50 is mounted for rotation.

Turning now to FIG. 11 which is a top view of another example advanced ZIF socket 10" it will be observed that the top plate 10a" is provided with a flat surface mount region 11" for an electrical device. In this advantageous example a rigid U-shaped bar 60 is fitted into a U-shaped groove 61 in the same fashion that the rigid bars 40, 41 of FIG. 8 were secured in grooves 42, 43 of FIG. 9. The U-shaped rigid bar 60 is secured in the U-shaped groove 61 such that the surface mount region 11″ for the electrical device is deposed within the U-shape of the U-shaped bar, to thereby ensure the surface mount region 11″ is flat and remains flattened in varying ambient conditions.

Figure 12:
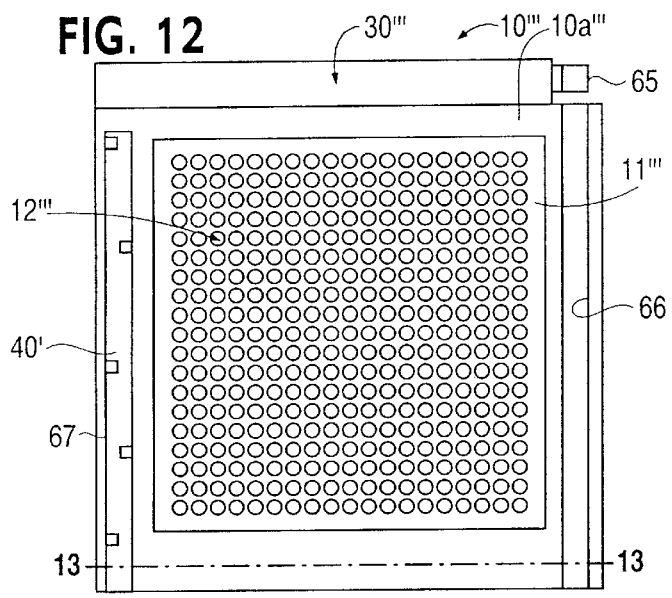
FIG. 12 is a top view of yet another example advanced lever activated ZIF socket embodiment of the invention.

Turn now to FIGS. 12, 13, 14 and 15, which illustrate yet another example of an advanced ZIF socket. FIG. 12 is a top view of a socket 10′″ that provides a flat surface mount region 11′″ for an electrical device. The socket 10′″ is comprised of a top plate 10a′″ adapted to provide the flat surface mount region 11′″, which includes a plurality of pin insertion apertures 12′″ adapted to permit insertion of electrical pin connections from the electrical device. The base 20′″, FIG. 10 includes a plurality of receptacles not shown in this figure of the nature shown and described earlier with respect to receptacles 13 in FIG. 3. The top plate 10a′″ is slidably mounted on the base 20′″. A cam mechanism 30′″ cooperates with the base 20′″ to slide the top plate 10a′″ over the base between an open and closed position in the manner shown and described in structural detail and function in FIGS. 4, 5, and 6 hereinbefore.

A cam mechanism 30′″ is secured to the base 20′″ and cooperates with the top plate 10a′″ to slide the top plate 10a′″ over the base 20′″ between an open and closed position.

Figure 13:
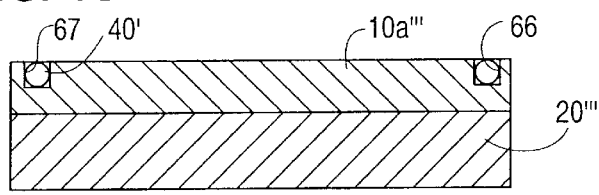
FIG. 13 is a section taken along line 13—13 in FIG. 12.
Figure 14:
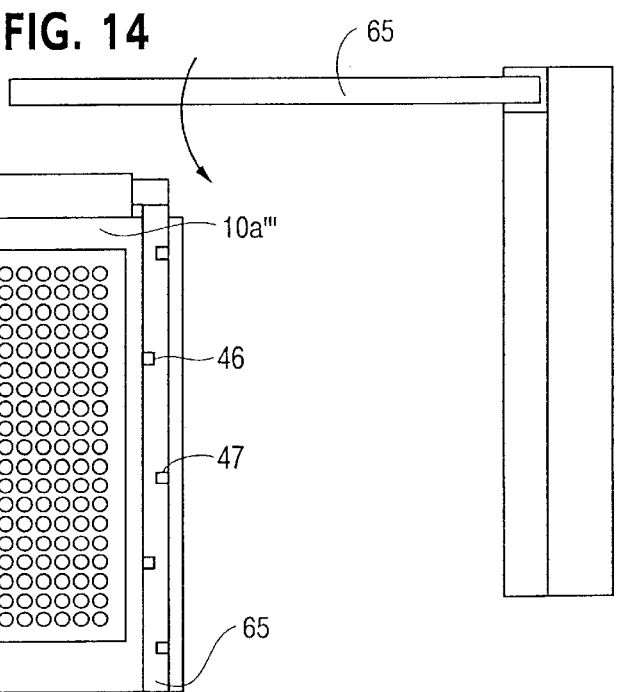
FIG. 14 is a side view of FIG. 12.
Figure 15:
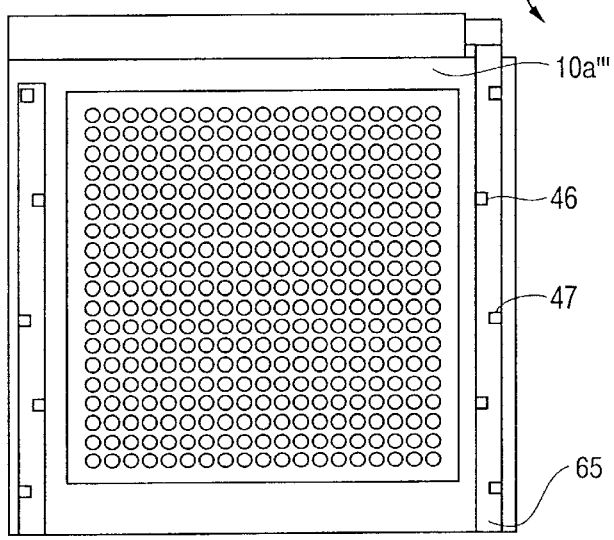
FIG. 15 is a top view of the arrangement of FIG. 12 wherein a lever of FIG. 15 is shown in a closed position.

A lever 65 is coupled as shown to the cam mechanism 30′″ and is pivotally movable from an open position as shown in FIGS. 12 and 14 to a closed position in FIGS. 13 and 15 to permit, in the open position, the insertion of the electrical pin connections of the electrical device through the top plate apertures 12′″ into the base receptacles (not shown). Pivotal movement of the lever 65 causes the top plate 10a′″ to move in relation to the base 20′″ to a closed position thereby causing the electrical pin connectors to be secured in the receptacles in the base.

The surface mount region 11′″ in the top plate 10a′″ includes a first groove 66 having a U-shaped cross-section. The first groove 66 is located contiguous to the surface mount region 11′″. Movement of the lever 65 from the open to closed positions causes the lever to securely engage the groove 66 (see FIG. 15) in the top plate 10a′″ to thereby ensure that the top plate and surface mount region is flat and remains flattened in varying ambient environments. Again, clips 46, 47 may be used for clipping and retaining the lever 65 into the groove 66. In the event that there is a need for an even grater assurance that surface mount region 11′″ is flat, the present invention may also employ a rigid bar 40′ secured in a second groove 67 (FIG. 13) parallel to the first groove 66, such that an electrical device positioned on the surface mount region 11′″ is deposed between the rigid bar 40′ in the second groove 67 and the lever 65 when the lever 65 is in the closed position and occupying the first groove 66.

By way of summary it will be readily appreciated in this advanced example of the present invention that the lever 65 works as both an actuation mechanism and a warpage reduction bar. The rigid lever 65 and the rigid bar 40′ together can make sockets flatter when other answers are not workable. Independent bars or rods make it possible to mold the housing and then flatten it. Where a warpage feature such as the aforementioned (BACKGROUND) thin (sheet metal) frame is secured to a top plate perimeter, the molding process may also warp the warpage frame features. The present invention using rigid bars or rods advantageously ensures a straightening effect to a socket surface mount region that guarantees the socket will meet flatness requirements, thereby improving yields, simplifying contact insertion and actuation by reducing warpage induced friction.

It is to be further noted that in the event an annealing process is involved in the manufacture and use of the present FIGS. 12–15 invention, then the annealing process may benefit from warpage bars being inserted before reflow, whereas warpage correction effects may be more beneficial after reflow.

Figure 16:
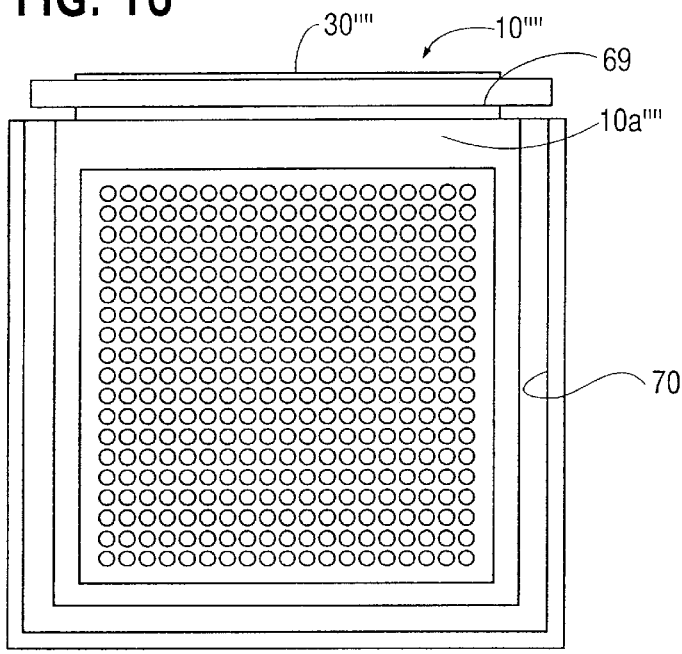
FIG. 16 is a top view of still yet another example advanced lever actuated ZIF socket embodiment of the invention.
Figure 17:
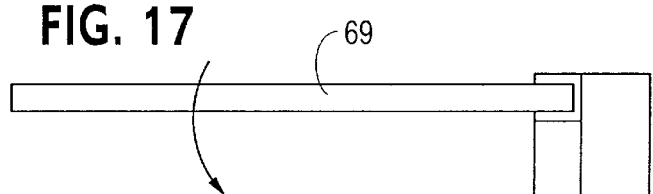
FIG. 17 is a side view of FIG. 16.
Figure 18:
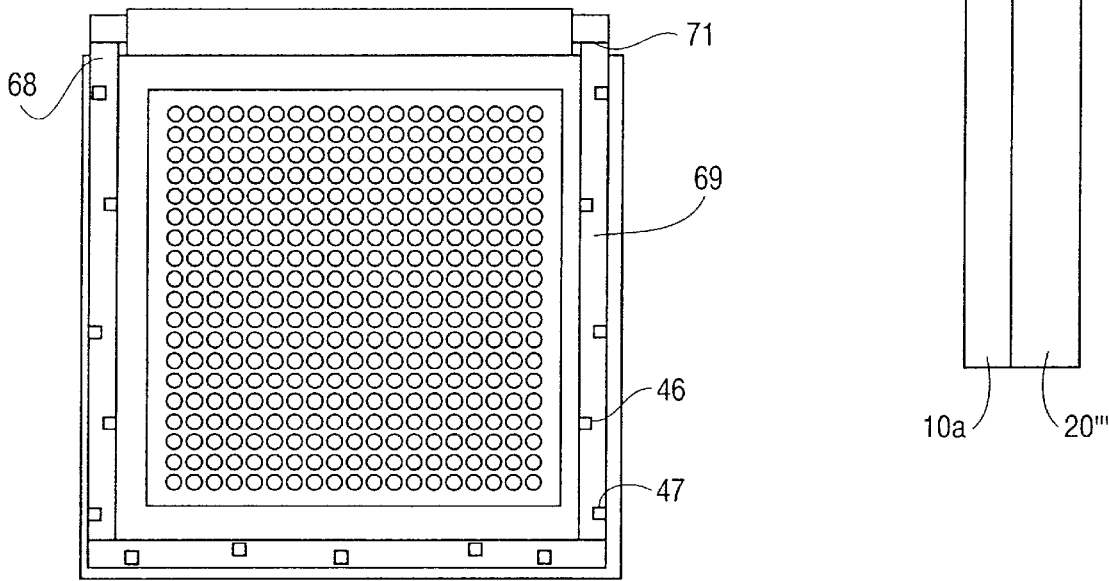
FIG. 18 is a top view of the arrangement of FIG. 16 wherein a lever of FIG. 16 is shown in a closed position.

Turn now to yet another example of an advanced ZIF socket illustrated in FIGS. 16, 17 and 18. Here again, as in FIG. 12, there is a top view of a zero-insertion force socket 10″″ that provides a flat surface mount region 11″″ on a top plate 10a″″. A cam mechanism 30″″ is secured to a base 20″″, as shown in FIG. 17 and cooperates with the top plate 10a″″ to slide the top plate over the base between an open and closed position. A U-shaped lever 69, best seen in FIG. 18 in a closed position and in an open position in FIGS. 16, 17, is coupled to the cam mechanism 30″″ at ends 68, 71 of the U-shaped lever 69 and is pivotally movable from an open position, (FIG. 16) to a closed position (FIG. 18). The top plate 10a″″ is provided with a U-shaped groove 70, as best observed in FIG. 16. The U-shaped groove 70 is located on the top plate 10a″″ such that legs of the U-shaped groove 70 thereby cause, upon movement of the lever from the open to the closed position, the U-shaped lever to securely engage the U-shaped groove 70 in the top plate 10″″. The pressure of the U-shaped lever 69 in the U-shaped groove 70 ensures that the top plate 10a″″ and the surface mount region is flat and remains flattened.

In the broadest sense, the present invention involves a method comprising the forming of at least one groove in a socket housing contiguous to a surface mount region for an electrical device and inserting one of a rigid bar and rod in the groove to thereby ensure that the surface mount region is flat and remains flat in varying ambient conditions. The method just set forth also contemplates as following within the spirit of the present invention, forming a second groove in the top plate and inserting a one of a second bar and rod in the top plate parallel to the one groove and bar such that the surface mount region is deposed between rigid bars or rods in parallel grooves.

The inventive method of the present invention also involves forming a U-shaped groove in a socket housing contiguous to a surface mount region for an electrical device, and inserting a U-shaped rigid bar or rod in a mating relationship in the U-shaped groove to provide a surface mount region for an electrical device within the U-shape of the U-shaped groove to thereby ensure that the surface mount region is flat and remains flattened in varying ambient conditions.

Another advanced method of the present invention involves establishing a flat surface mount region in a zero-insertion force socket that includes:

a socket housing having a top plate adapted to provide the flat surface mount region, the top plate providing a plurality of pin insertion apertures adapted to provide for insertion of electrical pin connections from the electrical device;

a base that has a plurality of receptacles adapted to receive pin electrical connections provided by the electrical device, the pin connections extending through the apertures in the top plate and into the receptacles;

the socket housing top plate and base have the capacity to slide relative to each other;

a cam mechanism that is secured to the base and cooperates with the top plate to slide the top plate over the base from an open to a closed position; and a lever coupled to the cam mechanism, wherein the lever is pivotally movable from an open position to a closed position to provide in the open position the insertion of the electrical pin connectors of the electrical device through the top plate apertures and into the base receptacles, whereupon pivotal movement of the lever to the closed position causes the electrical pin connectors to be secured in the receptacles in the base.

The other advanced method further involves forming a groove in the socket top plate of the socket housing contiguous to the surface mount region, and then moving the lever from its open position to the closed position to thereby cause the lever to securely engage the groove in the top plate and thereby ensure that the top plate and surface mount region are flat and remain flattened in varying ambient conditions.

The present invention involves yet another method of establishing a flat surface mount region a zero-insertion force socket that includes:

a socket housing having a top plate adapted to provide the flat surface mount region, the top plate providing a plurality of pin insertion apertures adapted to provide for the insertion of electrical pin connections from the electrical device;

a base that has a plurality of receptacles adapted to receive pin electrical connections provided by the electrical device, the pin connections extending through the apertures in the top plate and into the receptacles;

the socket housing top plate and base with the capacity to slide relative to each other;

a cam mechanism that is secured to the base and cooperates with the top plate to slide the top plate over the base from an open to a closed position; and a U-shaped lever coupled to the cam mechanism at the ends of the U-shaped lever, wherein the U-shaped lever is pivotally movable from an open position to a closed position to provide in the open position the insertion of the electrical pin connections of the electrical device through the top plate apertures and into the base receptacles, whereupon pivotal movement of the lever to the closed position causes the electrical pin connectors to be secured in the receptacles in the base.

This method further involves forming a U-shaped groove in the socket top plate of the socket housing such that the surface mount region for the electrical device is disposed within the legs of the U-shaped groove, and then moving the U-shaped lever from its open position to a closed position, thereby causing the U-shaped lever to securely engage the U-shaped groove in the top plate when the U-shaped lever is moved from the open to the closed position, thereby ensuring that the top plate and surface mount region is flat and remains flattened in varying ambient conditions.

In concluding, reference in the specification to an example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, the electrical contacts of the pin insertion apertures may be available in a variety of size and shapes with different projections. The cam mechanism may include different driving elements such as worn gears, wedges, ratchets, etc. Moreover, the camshaft of the cam mechanism may be positioned at various angles and may work with different sized and/or shaped levers. The overall dimensions of the ZIF socket may be altered depending upon the electrical elements used, the desired strength, the structural rigidity, and the thermal stability.

Of equal importance it is to be understood that the base upon which a top plate of the socket may slide will also benefit from the use of bars/rods inserted into grooves on the surface of the base to ensure that the top plate and base slide freely with respect to each other. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A zero insertion force socket that provides a flat surface mount region for an electrical device, the socket comprising:

a top plate adapted to provide a flat surface mount region, the top plate having a plurality of pin insertion apertures adapted to permit insertion of electrical pin connections from the electrical device, a base having a plurality of receptacles adapted to receive the pin electrical connections of the electrical device that extend through the apertures in the top plate and into the receptacles, the top plate is slidably mounted on the base, a cam mechanism is secured to the base and cooperates with the top plate to slide the top plate over the base between an open and closed position, a lever is coupled to the cam mechanism and is pivotally movable from an open position to a closed position to permit in the open position the insertion of the electrical pin connections of the electrical device through the top plate apertures and into the base receptacles, whereupon pivotal movement of the lever causes the top plate to move in relation to the base to a closed position, thereby causing the electrical pin connectors to be secured in the receptacles in the base, and the flat surface mount region includes a first groove in the top plate that is contiguous to the surface mount region, whereupon movement of the lever from the open to closed position causes the lever to securely engage the groove in the top plate to thereby ensure that the top plate and the surface mount region is flat and remains flattened in varying ambient environments.

2. The socket as claimed in claim 1, wherein the flattened surface mount region in the top plate includes adjacent the surface mount region a rigid bar secured in a second groove parallel to the first groove such that an electrical device positioned on the surface mount region is disposed between the rigid bar in the second groove and the lever when the lever is in the closed position and occupying the first groove.

3. The socket as claimed in claim 2, wherein the grooves are U-shaped channels.

4. The socket as claimed in claim 3, wherein the rigid bar and lever are rod shaped.

5. A zero insertion force socket that may be actuated and provides a flat surface mount region for an electrical device, the socket comprising:

a top plate adapted to provide a flat surface mount region, the top plate having a plurality of pin insertion apertures adapted to permit insertion of electrical pin connections from the electrical device, a base having a plurality of receptacles adapted to receive the pin electrical connections of the electrical device that extend through the apertures in the top plate and into the receptacles, the top plate is slidably mounted on the base, a cam mechanism is secured to the base and cooperates with the top plate to slide the top plate over the base between an open and closed position, a U-shaped lever is coupled to the cam mechanism at ends of legs of the U-shaped lever and is pivotally movable from an open position to a closed position to permit in the open position the insertion of the electrical pin connections of the electrical device through the plate apertures and into the base receptacles whereupon pivotal movement of the lever to the closed position causes the electrical pin connectors to be secured in the receptacles in the base, and the top plate is provided with a U-shaped groove such that the surface mount region for the electrical device is disposed within legs of the U-shaped groove to thereby cause, upon movement of the lever from the open to the closed position, the U-shaped lever to securely engage the U-shaped groove in the top plate and thereby ensure that the top plate and the surface mount region is flat and remains flattened in varying ambient conditions.

6. The socket as claimed in claim 5, wherein the U-shaped grooves have a U-shaped cross-section.

7. The socket as claimed in claim 6, wherein U-shaped lever has a rod shaped cross section.

8. A socket comprising:

a base having a plurality of receptacles adapted to receive electrical pin connections of an electrical device;

a top plate slidably mounted on the base, having a plurality of pin insertion apertures adapted to permit insertion of the electrical pin connections of said electrical device within a surface mount region; and a cam mechanism operable to slide the top plate over the base between an open and closed position, so as to secure an electrical coupling of the electrical pin connections of said electrical device with the receptacles of the base, when said electrical device is mounted on the surface mount region, wherein the top plate is provided with warpage reinforcement bars arranged in parallel, and secured in corresponding grooves on opposite sides of the surface mount region that is contiguous to the surface mount region, so as to ensure that the surface mount region is flat and remains flattened in varying ambient conditions.

9. The socket as claimed in claim 8, wherein the warpage reinforcement bars are formed by high strength materials, and are secured in the corresponding grooves on the opposite sides of the surface mount region on the top plate, via clips.

10. The socket as claimed in claim 8, wherein one of the two warpage reinforcement bars arranged in parallel on opposite sides of the surface mount region is an actuation lever of the cam mechanism, which acts both to actuate the socket and to flatten the socket.

11. The socket as claimed in claim 8, wherein the warpage reinforcement bars are rod shaped.

12. A socket comprising:

a base having a plurality of receptacles adapted to receive electrical pin connections of an electrical device;

a top plate slidably mounted on the base, having a plurality of pin insertion apertures adapted to permit insertion of the electrical pin connections of said electrical device within a surface mount region; and a cam mechanism operable to slide the top plate over the base between an open and closed position, so as to secure an electrical coupling of the electrical pin connections of said electrical device with the receptacles of the base, when said electrical device is mounted on the surface mount region, wherein the top plate is provided with a U-shaped warpage reinforcement frame secured in a corresponding U-shaped channel surrounding the surface mount region that is contiguous to the surface mount region, so as to ensure that the surface mount region is flat and remains flattened in varying ambient conditions.

13. The socket as claimed in claim 12, wherein the U-shaped warpage reinforcement frame is also part of the cam mechanism configured to serve as an actuation lever to actuate the socket as well as to flatten the socket.

14. The socket as claimed in claim 12, wherein the U-shaped warpage reinforcement frame has a rod shaped cross section.

15. The socket as claimed in claim 12, wherein the U-shaped warpage reinforcement frame is formed by high strength materials, and is secured in the corresponding U-shaped channel surrounding the surface mount region on the top plate, via clips.

* * * * *